United States Patent
Heo et al.

(10) Patent No.: US 6,432,774 B2
(45) Date of Patent: Aug. 13, 2002

(54) METHOD OF FABRICATING MEMORY CELL WITH TRENCH CAPACITOR AND VERTICAL TRANSISTOR

(75) Inventors: Kuen-Chy Heo, Chiai Hsien; Jeng-Ping Lin, Taoyuan Hsien, both of (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 09/854,698

(22) Filed: May 15, 2001

(30) Foreign Application Priority Data

May 16, 2000 (TW) ........................... 89109311 A (51) Int. Cl.[7] ............................. H01L 21/336
(52) U.S. Cl. ................. 438/270; 438/386; 438/589
(58) Field of Search ................. 257/301, 302; 438/138, 242, 243, 244, 268, 270, 272, 386, 387, 589

(56) References Cited

U.S. PATENT DOCUMENTS

| | | | | |
|---|---|---|---|---|
| 5,519,236 A | * | 5/1996 | Ozaki | 257/302 |
| 6,172,898 B1 | * | 1/2001 | Kajiyama | 257/301 |
| 6,184,549 B1 | * | 2/2001 | Furukawa et al. | 257/301 |
| 6,333,533 B1 | * | 12/2001 | Furukawa et al. | 257/296 |

FOREIGN PATENT DOCUMENTS

JP      411135757 A  *  5/1999

* cited by examiner

Primary Examiner—Olik Chaudhuri
Assistant Examiner—Hoai Pham
(74) Attorney, Agent, or Firm—Birch, Stewart, Kolasch & Birch, LLP (57) ABSTRACT

A method of fabricating a vertical transistor of a memory cell is disclosed. According to this method, a semiconductor substrate is first provided. A pad layer is formed over the substrate. Then, a deep trench is formed in the substrate. In the deep trench, a trench capacitor is formed, a collar oxide layer is then formed on the sidewalls above the trench capacitor. A first conductive layer is formed above the trench capacitor. A second conductive layer is formed to fill the deep trench. The pad layer, the substrate, the first and the second conductive layers and the collar oxide layer are patterned. A first insulating layer is deposited to form the Shallow Trench Isolation. Both sides of the Shallow Trench Isolation and a portion of the second conductive layer are removed to form a buried strap and an opening. The pad layer is removed. A second insulating layer is formed over the substrate and the buried strap, and is removed after forming a well. A third insulating layer is formed on the substrate. After removing the third insulating layer on top surface of the substrate, the gate oxide is formed. Sequentially, a third conductive layer and a fourth conductive layer are formed to fill the opening and to cover the substrate. The third and the fourth conductive layers are patterned to form the gate. The source/drain regions and a fourth insulating layer are formed. The fabrication of the vertical transistor of a memory cell is completed.

20 Claims, 12 Drawing Sheets

METHOD OF FABRICATING MEMORY CELL WITH TRENCH CAPACITOR AND VERTICAL TRANSISTOR

BACKGROUND OF THE INVENTION

1. Field of the Invention

The present invention relates to a method of fabricating a memory cell with a transistor, and more particularly, to a dynamic random access memory (DRAM) cell having a vertical transistor.

2. Description of the Prior Art

A DRAM cell comprises a metal-oxide-semiconductor field effect transistor (MOSFET) and a capacitor that are built in a semiconductor silicon substrate. There is an electrical contact between the drain of a MOSFET and the bottom storage electrodes of the adjacent capacitor, forming a memory cell of the DRAM device. A large number of memory cells make up the cell arrays which combine with the peripheral circuit to produce DRAMs.

In recent years, the sizes of the MOSFETs have continuously shrunk so that the packing densities of these DRAM devices have increased considerably. For example, new techniques for manufacturing extremely small transistor elements have been developed for 1 Giga bit DRAMs and beyond. One of the methods of increasing integration is to form a three-dimensional transistor structure, instead of the commonly used planar-type transistor.

Figure 1A:
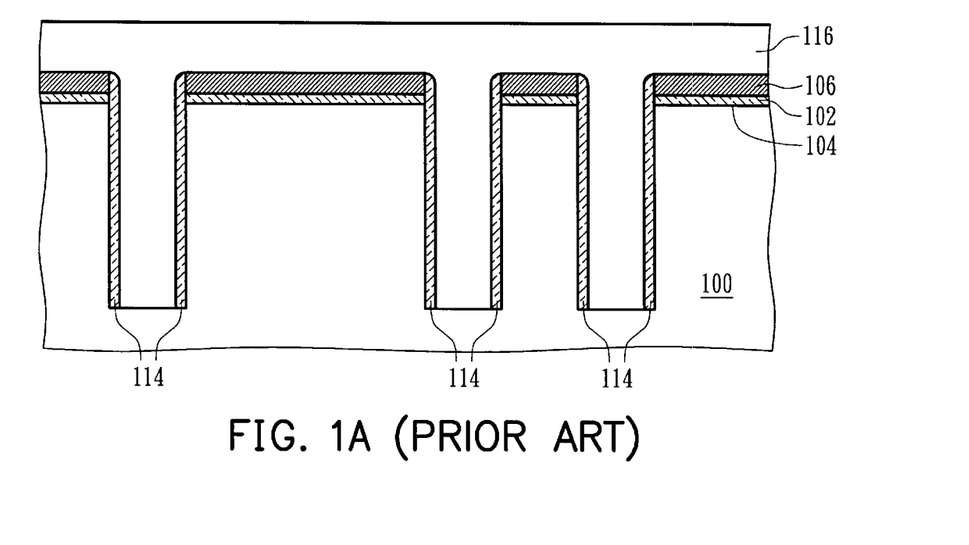
FIGS. 1A through 1G show schematic cross-sectional views of a partially fabricated integrated circuit structure at successive stages in forming a transistor of a DRAM cell of the prior art.

Referring to FIG. 1A, a semiconductor substrate 100 is provided. A pad oxide layer 102 is formed on the substrate 104 by using an oxidation process. Then, a pad nitride layer 106 and a BPSG layer (not shown) are formed by LPCVD process on the pad oxide 102. The BPSG layer, the pad nitride layer 106, the pad oxide layer 102 and the substrate 100 are defined to form a deep trench 112 by photolithography and etching process. Then, the BPSG layer is removed. At the lower portion of the trench 112, a trench capacitor (not shown) is formed by using conventional process. Then, a thin collar oxide layer 114 is formed on the sidewalls of the upper portion of the deep trench 112 that are above the trench capacitor. A polysilicon layer 116 is formed and fills up the inner space of the deep trench 112.

Figure 1B:
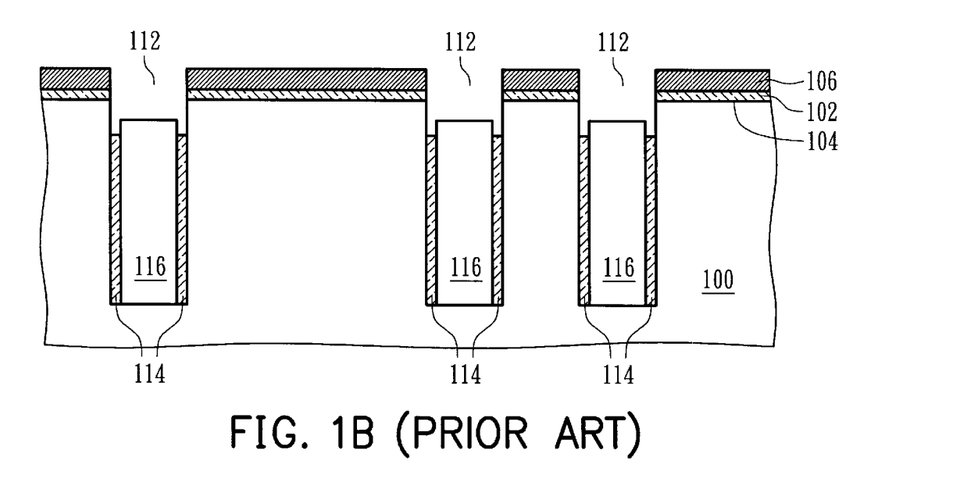

Referring to FIG. 1B, the polysilicon layer 116 is etched back until the surface of the polysilicon layer 116 in the deep trench 112 is lower than the surface of the substrate 104. Then, the collar oxide layer 114 over the top surface of the polysilicon 116 is over-etched until the top of the collar oxide layer 114 is lower than the top surface of the polysilicon layer 116.

Figure 1C:
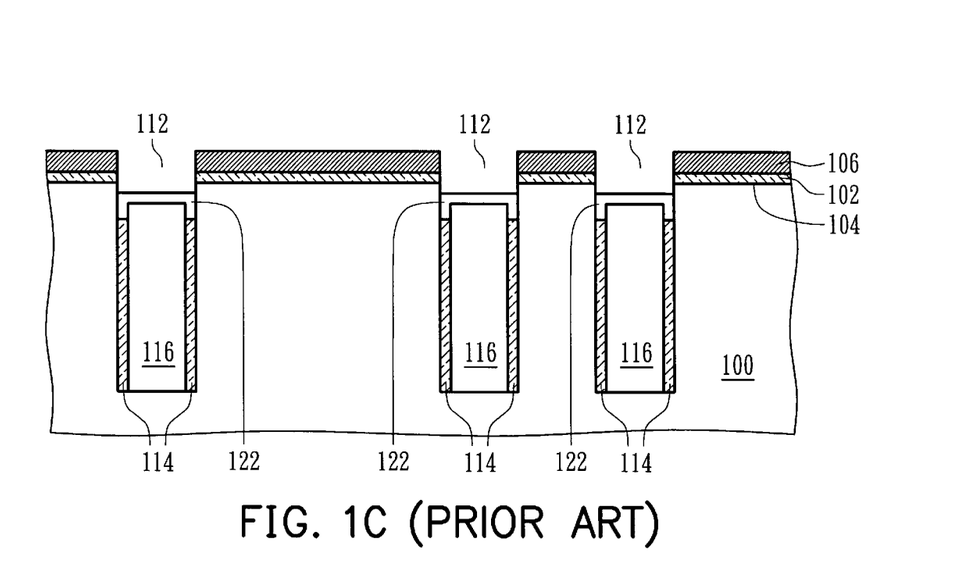

Referring to FIG. 1C, a doped polysilicon layer (not shown) is deposited on the surface of the pad nitride layer 106 and fills the inner space of the deep trench 112. The doped polysilicon layer on the pad nitride layer 106 is removed by a Chemical Mechanical Polishing (CMP) process. The pad nitride layer 106 acts as an etching stop layer while removing the doped polysilicon layer. Then, the doped polysilicon layer in the deep trench 112 is etched back until the top surface of the doped polysilicon in the deep trench 112 is lower than the surface of the substrate 104 at a predetermined distance. The residual doped polysilicon layer in the deep trench 112 forms the buried strap 122.

Figure 1D:
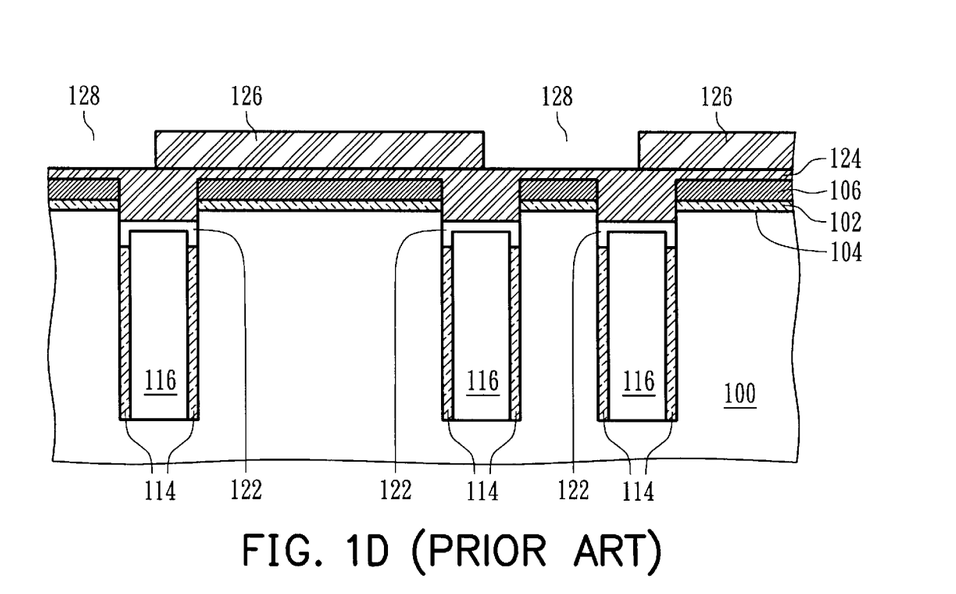

Referring to FIG. 1D, an anti-reflection coating (ARC) layer 124 is deposited on the pad nitride layer 106 and fills the inner space of the deep trench 112. A photoresist layer 126 is coated on the anti-reflection coating layer 124, and then a first opening 128 is defined and formed on the photoresist layer 126 by photolithography.

Figure 1E:
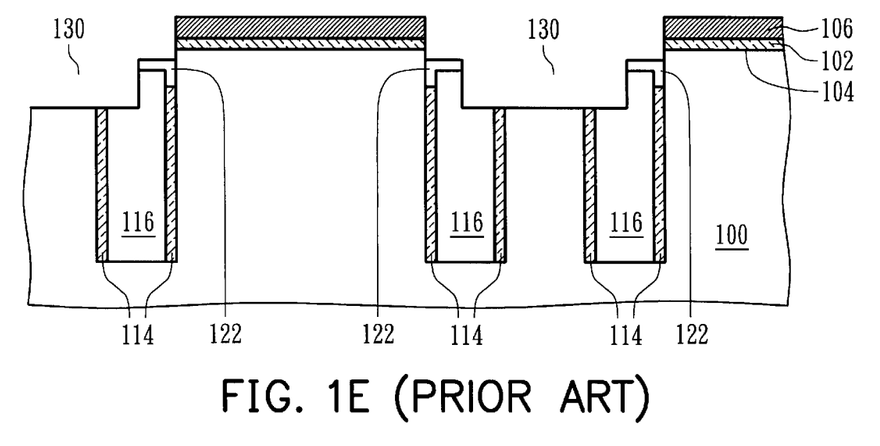

Referring to FIG. 1E, an opening 130 is formed by anisotropically etching away the anti-reflection coating layer 124, the pad nitride layer 106, oxide layer 102, the buried strap 122, the collar oxide layer 114, the first conductive layer 116 and the substrate 100. The photoresist layer 126 and the residual ARC layer 124 are then removed.

Figure 1F:
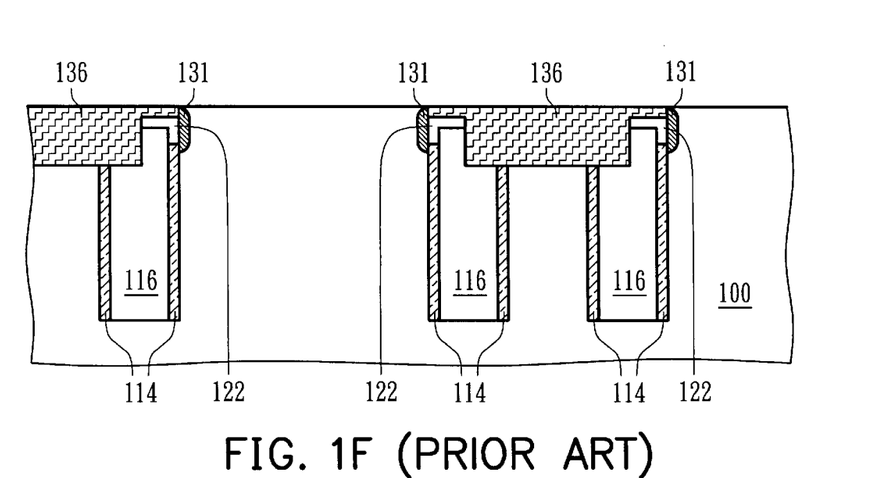

Referring to FIG. 1F, the opening 130 is filled with an insulating layer (not shown) made of high-density plasma oxide. The pad nitride layer 106, the pad oxide layer 102 and a portion of the insulating layer are planarized by a CMP process, and an etch-back process is performed to remove a portion of the insulating layer to the surface 104 of the substrate 100. Then, the pad nitride layer 106 and the pad oxide layer 102 are removed by an etch-back process. Thus the insulating layer in the opening 130 forms the shallow trench isolation (STI) 136. The impurities contained in the buried strap 122 out-diffuse into the substrate 100 to form the source region 131 because of the high temperature during the mentioned manufacturing processes.

Figure 1G:
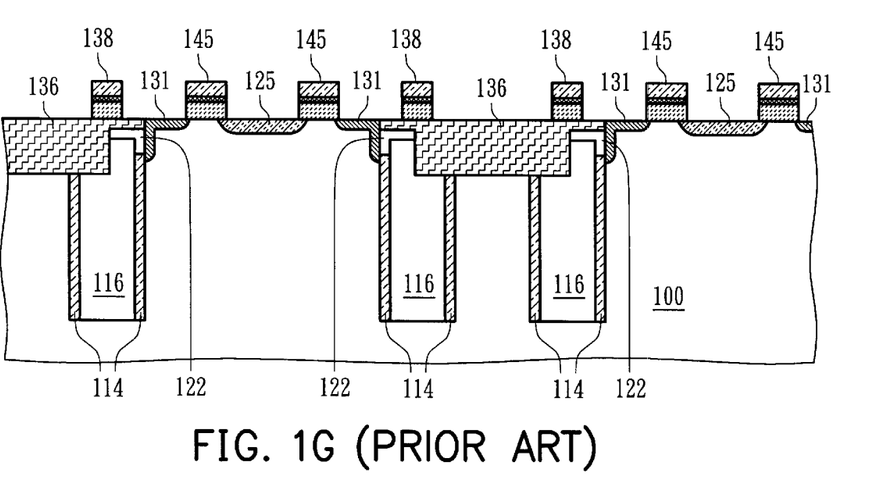

Referring to FIG. 1G, a polysilicon layer (not shown), a tungsten silicide layer (not shown) and a nitride layer (not shown) are sequentially deposited on the surface of the substrate 100 and STI 136. Then, the gates 145 and the second word lines 138 are formed on the surface of the substrate 100 and STI 136 by defining the polysilicon layer, the tungsten silicide layer and the nitride layer by photolithography and anisotropic etching. A drain region 125 is formed by using the gates 145 as the mask and implanting N type dopants such as P or as into the substrate 100. Thus, the manufacturing of a memory cell is completed.

Since the packing density of the DRAM increases and the size of the transistors and capacitors continuously scales down, the distance between the source region 131 and the drain region 125 is shortened. Accordingly, the source region 131 tends to overlap with the drain region 125 in the conventional manufacturing process, causing that the gates 145 loss the switching function and the device always turns on. That is, the memory device can not work.

SUMMARY OF THE INVENTION

Accordingly, an object of the present invention is to provide a method of fabricating a vertical transistor that can prevent the drain region and the source region from short-circuiting. According to this invention, a new method of fabricating the semiconductor with a vertical transistor is set forth. The vertical transistor is fabricated in the trench instead of on the surface of the substrate. The gate is located in the trench and extends to the surface of the substrate and the shallow trench isolation. The source region and the drain region are then fabricated perpendicularly to each other, and will be no longer to overlap with each other. The depth of trench and the location of the gate can be controlled to avoid the overlap of the source region and the drain region.

In order to achieve the above object, this invention provides a method of fabricating a vertical transistor of a memory cell, which is described below. A semiconductor substrate is first provided. A pad layer is formed on the surface of the substrate. Then, a deep trench is formed in the substrate. A trench capacitor is formed at the lower portion of the deep trench. A collar oxide layer is formed on the sidewalls the upper portion of the deep trench that is above trench capacitor. A first conductive layer is formed above the trench capacitor and is etched to a first predetermined depth in the deep trench to form a first opening. The portion of the collar oxide layer above the first conductive layer is removed. Then, a second conductive layer is formed to fill the first opening. A planarization process is performed to remove the second conductive layer over the pad layer. The pad layer, the substrate, the second conductive layer, the collar oxide layer and the first conductive layer are patterned to a second predetermined depth to form a second opening. A first insulating layer is formed on both of the pad layer and the second conductive layer and fills the second opening. A portion of the first insulating layer is removed to form the Shallow Trench Isolation. Both sides of the Shallow Trench Isolation and a portion of the second conductive layer are removed to a third predetermined depth, thus a third opening is formed. The residual second conductive layer forms a buried strap. The pad layer is removed to expose the surface of the substrate. A second insulating layer is formed on both of the exposed surface of the substrate and the buried strap. A well is formed at the upper portion of the substrate. The second insulating layer is removed. A third insulating layer is formed on the exposed surface of the substrate. After removing the third insulating layer on top surface of the substrate, the gate oxide is formed. Sequentially, a third conductive layer and a fourth conductive layer are formed to fill the fourth opening and to cover the surface of both the substrate and the shallow trench isolation. The third conductive layer and the fourth conductive layer are patterned to form the gate. The source and drain regions are formed. And a fourth insulating layer is formed. The fabrication of the vertical transistor of a memory cell is completed.

BRIEF DESCRIPTION OF THE DRAWINGS

The accompanying drawings form a material part of this description, in which.

DETAILED DESCRIPTION OF THE PREFERRED EMBODIMENT

The invention disclosed herein directed to a method of fabricating the vertical transistor of DRAMs. In the following description, numerous details are set forth in order to provide a thorough understanding of the present invention. It will be appreciated by ones skilled in the art that variations of these specific details are possible while still achieving the results of the present invention. Well-known processing steps are not described in detail in order not unnecessarily to obscure the present invention.

Figure 2A:
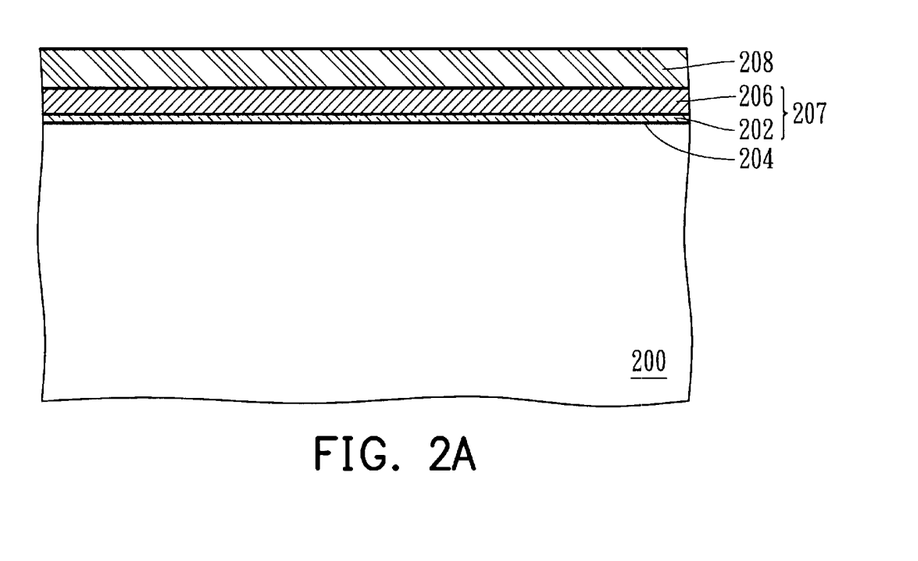
FIGS. 2A through 2P show schematic cross-sectional views of a partially fabricated integrated circuit structure at successive stages in forming a vertical transistor of a DRAM cell according to an embodiment of the present invention.

Referring now to FIG. 2A, a semiconductor substrate 200 is provided. The semiconductor substrate 200 is composed of silicon or germanium. The substrate 200 can be made by epitaxial silicon or silicon on insulator. For simplicity, a P-type semiconductor silicon substrate 200 is taken as an example in this invention. An oxidation process is used to form a pad oxide layer 202 on the surface of the substrate 204. The thickness of the pad oxide layer 202 is about 150 angstroms. A pad nitride layer 206 is then formed over the pad oxide 206 by CVD process. The thickness of the pad nitride layer 206 is about 1500 to 3000 angstroms. The pad oxide 202 and the pad nitride 206 constitute the pad layer 207. A first masking layer 208, which has a thickness of about 5000 to 20000 angstroms, is formed over the pad layer 207. The first masking layer 208 is composed of boron silicate glass (BSG) by situ doped boron ions in silicate glass which is formed by CVD, APCVD, SAPCVD, LPCVD, PECVD or HDPCVD technique. Thereafter, the first masking layer 208 is planarized by thermal reflow, etch-back or chemical mechanical polishing (CMP) techniques.

Figure 2B:
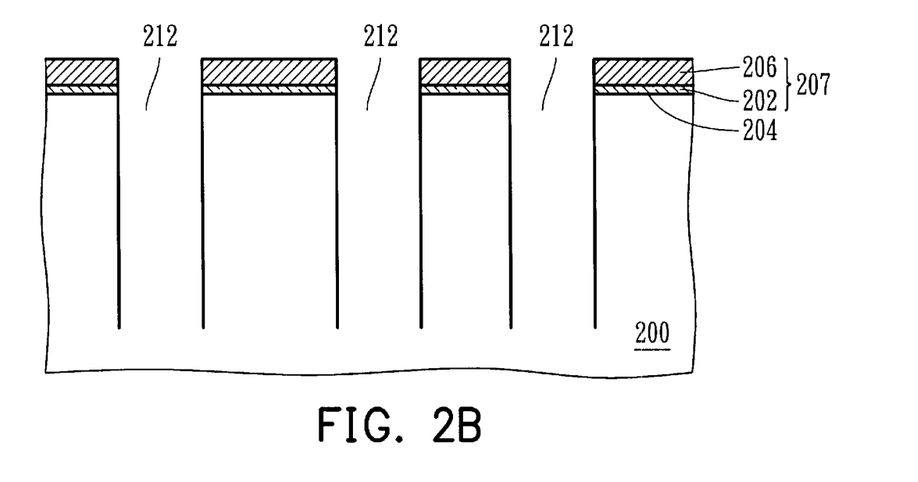

Referring to FIG. 2B, the first masking layer 208 is defined by photolithography and etching processes. Then, by using the first masking layer 208 as a mask, the pad layer 207 and the substrate 200 are patterned to form a deep trench 212 on the substrate 200. After the formation of the deep trench 212, the first masking layer 208 is removed by an isotropic etching process, in which the pad layer 207 is used as an etching stop layer. Then, a trench capacitor 250 (not shown) is formed at the lower portion of the deep trench 212 by conventional processes.

Figure 2C:
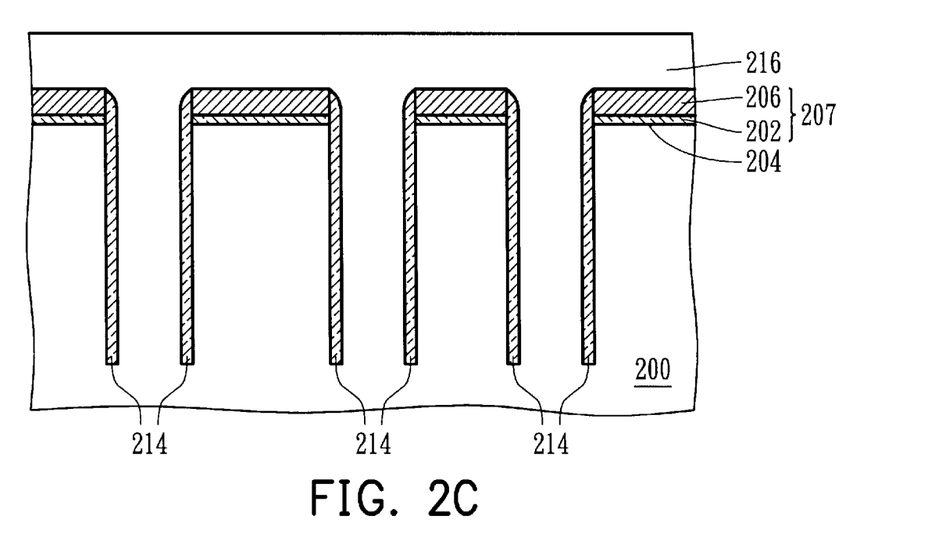

Referring to FIG. 2C, a collar oxide layer 214 is formed on the sidewalls of the upper portion of the deep trench 212 that is above the trench capacitor. The collar oxide layer 214 can be composed of silicon oxide formed by CVD technique. The thickness of the collar oxide layer 214 is about 200 to 1000 angstroms. Then, a first conductive layer 216 is formed above the pad layer 207 and fills the inner space of the deep trench 212. The first conductive layer 216 is usually composed of polysilicon doped with arsenic ions or phosphorus ions. The first conductive layer 216 is formed by LPCVD technique with diffusion process, ion implantation or in-situ doped process and has a thickness of 2500 to 4000 angstroms.

Figure 2D:
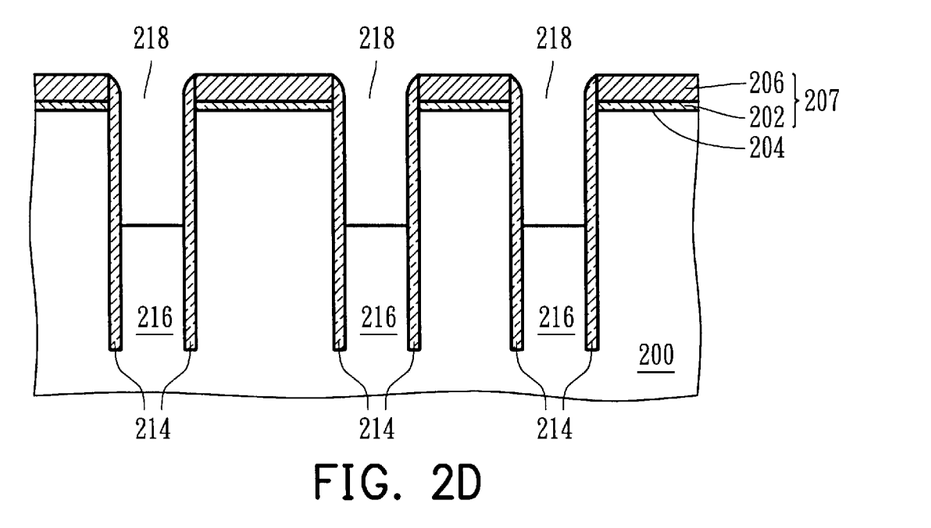

Referring to FIG. 2D, by using the pad layer 207 as the stop layer, the first conductive layer 216 above the pad layer 207 is removed by using a planarization process, such as the chemical mechanical polishing (CMP) technique. Then, an etch-back process is performed to remove a portion of the first conductive layer 216 in the deep trench 212 to a first predetermined depth to form a first opening 218. The top surface of the residual first conductive layer 216 is lower than the surface of the substrate 204. The first predetermined depth is 2500 to 5500 angstroms beneath the surface of the substrate.

Figure 2E:
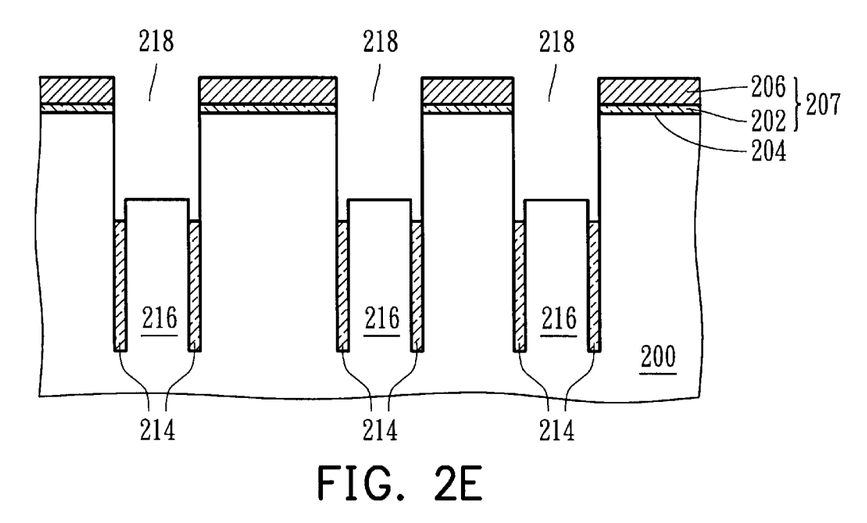

Referring to FIG. 2E, a portion of the collar oxide layer 214 is removed by using an overetch process until the top surface of the collar oxide layer 214 is lower than the top surface of the first conductive layer 216.

Figure 2F:
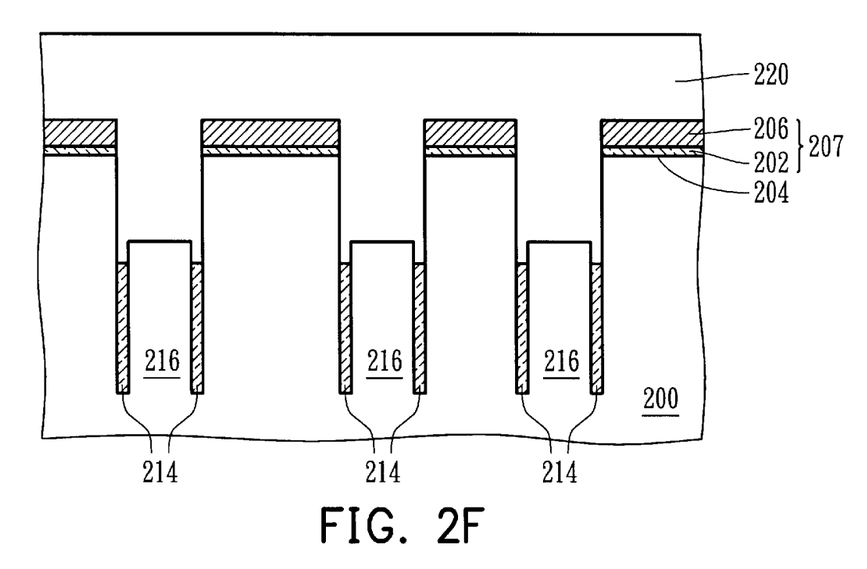

Referring to FIG. 2F, a second conductive layer 220 is formed on the surface of the pad layer 207 and fills the inner space of the first opening 218. The second conductive layer 220 is composed of polysilicon doped with arsenic ions or phosphors ions, which can be formed by the LPCVD technique with diffusion process, ion implantation or in-situ doped process. The second conductive layer 220 has a thickness of 2500 to 4000 angstroms.

Figure 2G:
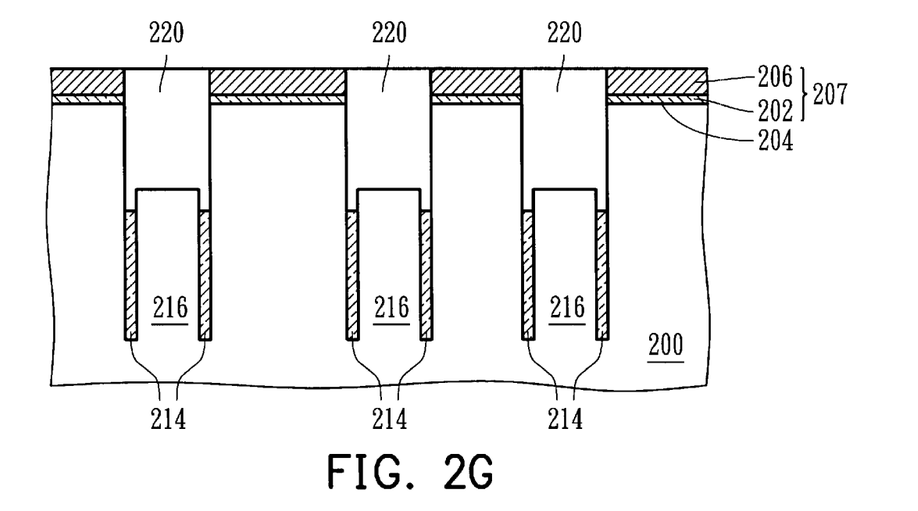

Referring to FIG. 2G, the second conductive layer 220 over the pad layer 207 is removed by a planarization process such as chemical mechanical polishing (CMP) technique, in which the pad layer 207 is used as the stop layer.

Figure 2H:
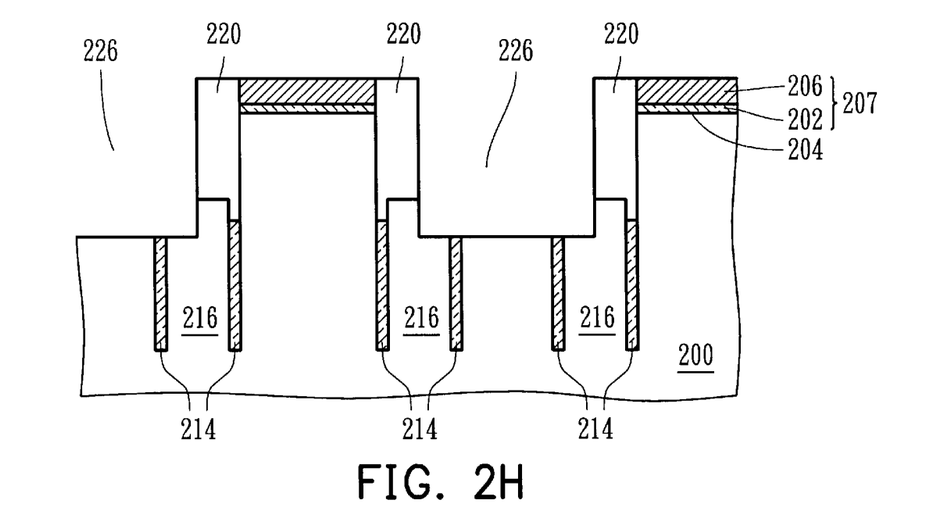

Referring to FIG. 2H, the pad layer 207, the substrate 200, the second conductive layer 220, and the collar oxide layer 214 and the first conductive layer 216 are defined to a second predetermined depth to form a second opening 226. The second predetermined depth is about 3000 to 6000 angstroms beneath the surface of the substrate 204.

Figure 2I:
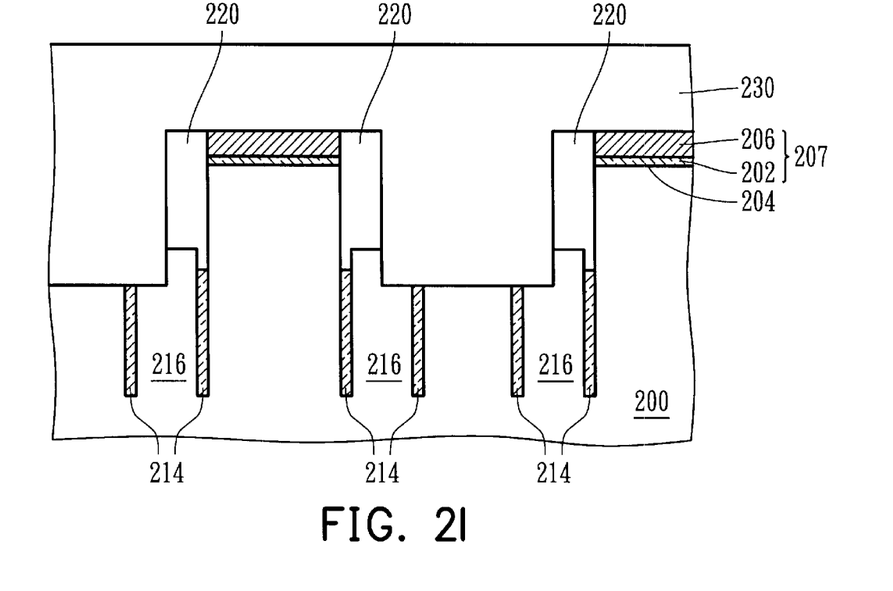

Referring to FIG. 2I, a first insulating layer 230 is formed on both the pad layer 207 and the second conductive layer 220 and fills the second opening 226. The first insulating layer 230, which has a thickness of 4000 to 7000 angstroms, is composed of High Density Plasma Oxide layer formed by High Density Plasma Chemical Vapor Deposition (HDPCVD) technique or oxide layer formed by CVD technique.

Figure 2J:
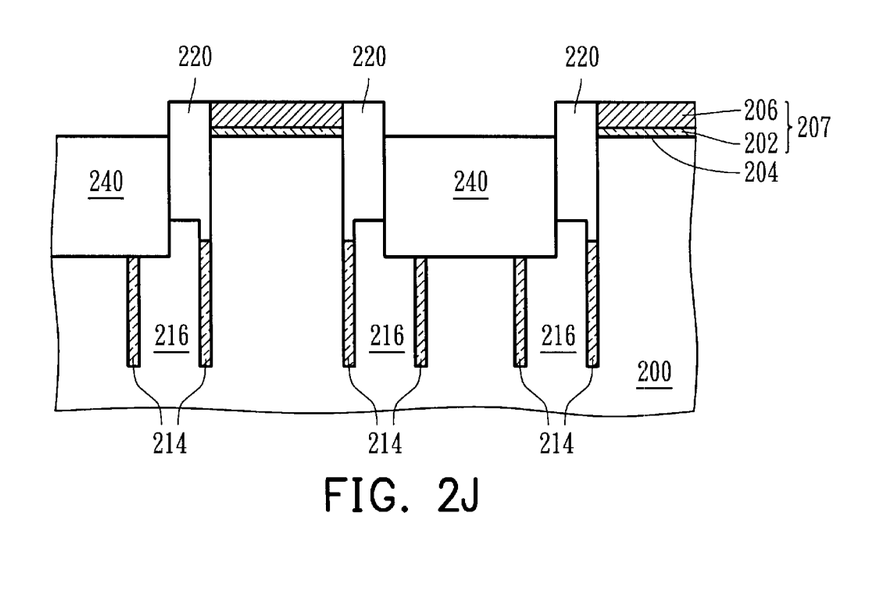

Referring to FIG. 2J, an etch-back process is performed to remove a portion of the first insulating layer 230 to form the Shallow Trench Isolation 240. The etch-back process is an isotropic etching process.

Figure 2K:
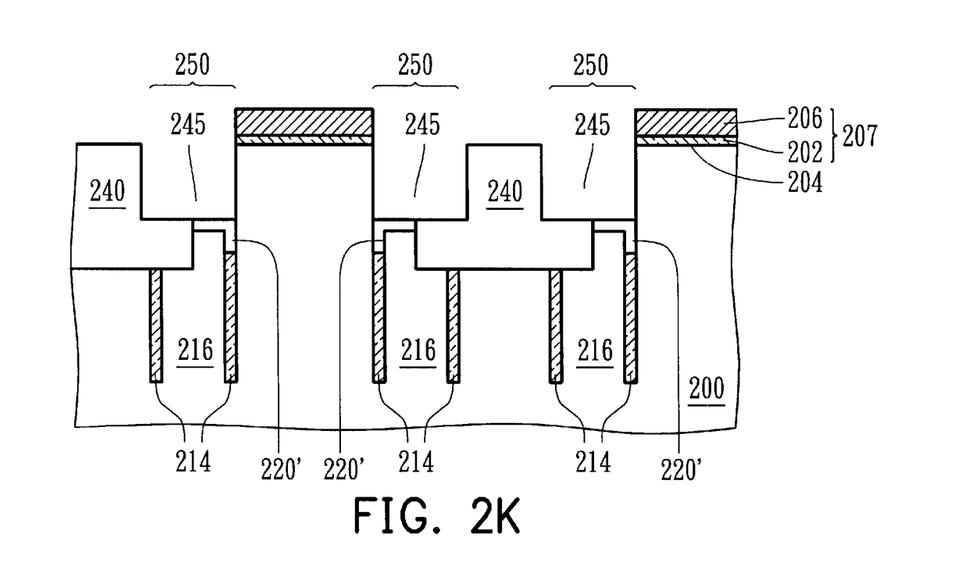

Referring to FIG. 2K, Shallow Trench Isolation 240 and the second conductive layer 220 are defined, then, an etching process is performed to remove both sides of the Shallow Trench Isolation 240 and a portion of the second conductive layer 220 to a third predetermined depth to form a third opening 245. The residual second conductive layer 220 forms a buried strap 220'. The third predetermined depth is about 2000 to 5000 angstroms beneath the surface of the substrate 204.

Figure 2L:
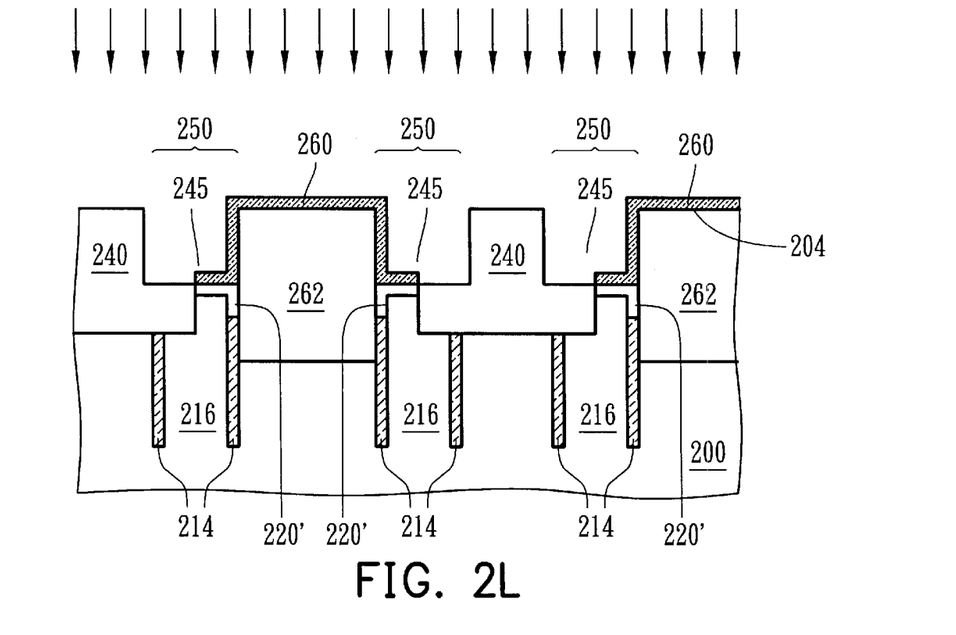

Referring to FIG. 2L, the pad layer 207 is then removed to expose the surface 204 of the substrate by an etching step. The etching process can be an isotropic etching process. A second insulating layer 260 is formed on the exposed surface of the substrate 200 and the surface of the buried strap 220'. The second insulating layer 260 is composed of thermal oxide layer formed by a rapid thermal oxidation process and has a thickness of 50 to 150 angstroms. Then, the conventional technique is used to dope some ions into the substrate 200 to form a well 262 at the upper portion of the substrate 200. The purpose of forming the second insulating layer 260 is to protect the surface of the substrate 204 from being destroyed by the ion bombardment while forming the well 262. The other purpose of forming the second insulating layer 260 is to prevent the channeling effect from occurring on the surface of the substrate 204, so that the depth and the ions concentration of implantation can be easily controlled.

Figure 2M:
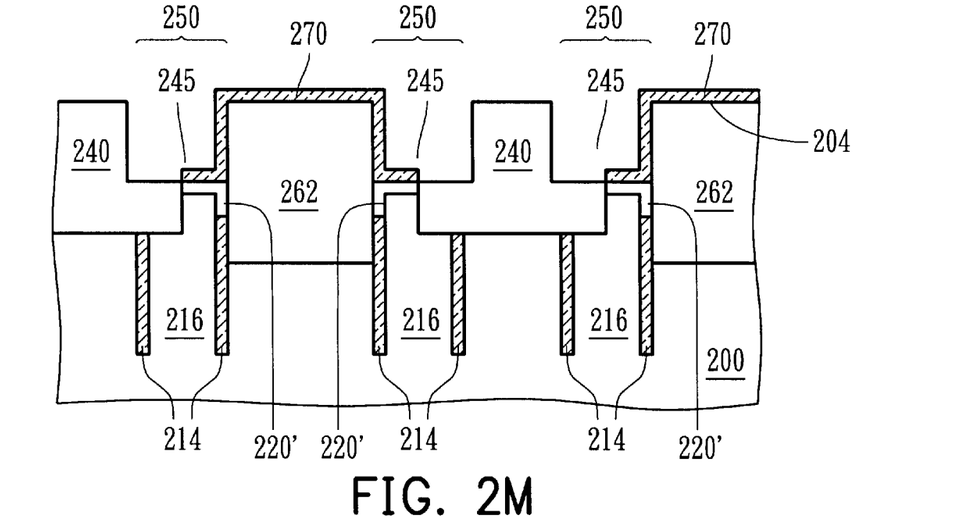

Referring to FIG. 2M, the second insulating layer 260 is removed by an etching process. The etching process can be the isotropic etching process. A third insulating layer 270 is formed on the exposed surface of the substrate 200. and the surface of the buried strap 220'. The third insulating layer 270, which has a thickness of 50 to 150 angstroms, is composed of a thermal oxide layer formed by a thermal oxidation.

Figure 2N:
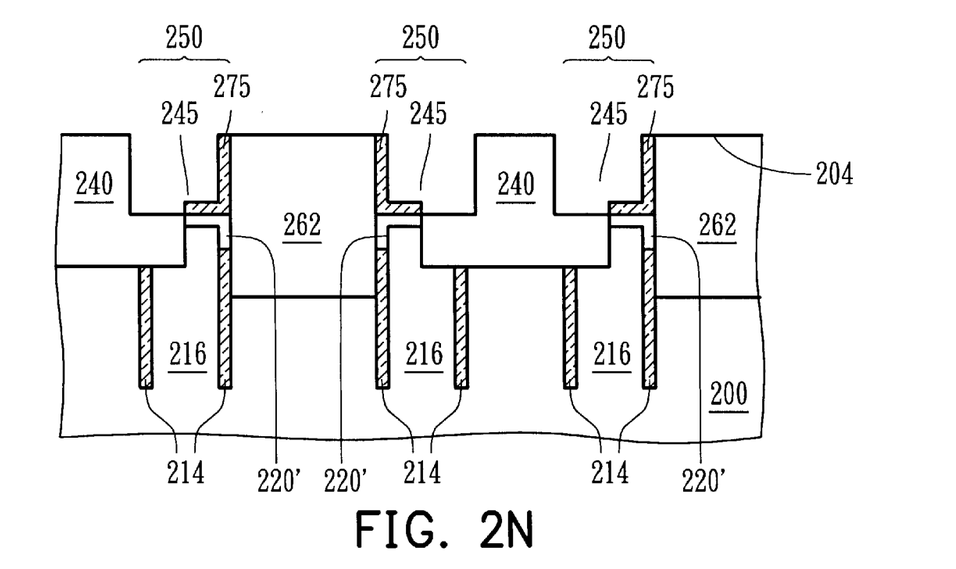

Referring to FIG. 2N, the third insulating layer 270 on the top surface of the substrate 200 is removed by an etching process. The etching process is preferably an anisotropic etching process. The residual third insulating layer 270 on the side wall of the third opening 245 and the surface of the buried strap 222' forms the gate oxide 275. In another embodiment of this invention, the third insulating layer 270 remains and also acts as the gate oxide 275.

Figure 2O:
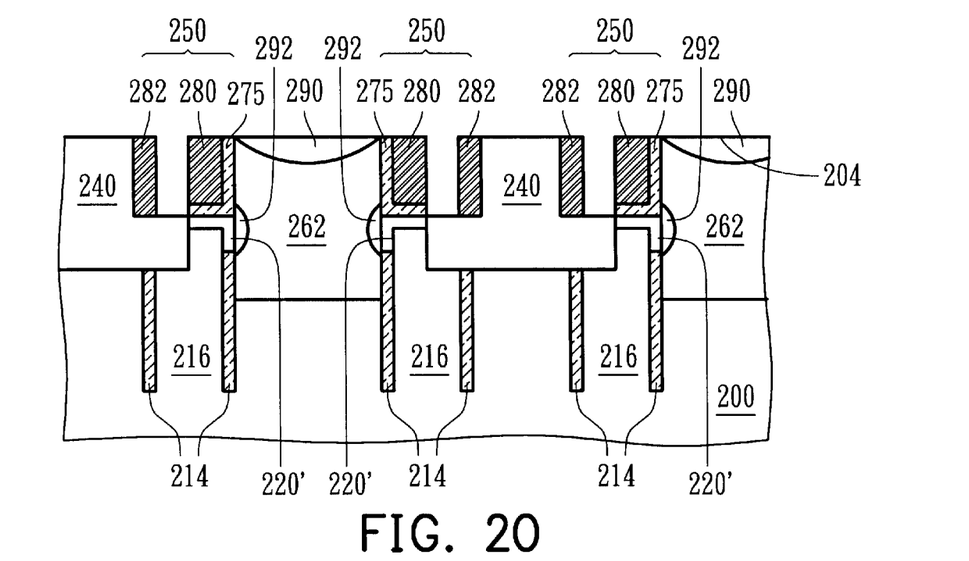

Referring to FIG. 2O, a third conductive layer (not shown) having a thickness of about 650 to 1000 angstroms and a fourth conductive layer (not shown) having a thickness of about 500 to 900 angstroms are formed to fill the third opening 245 and cover the surface of both the substrate 204 and the Shallow Trench Isolation 240. The third conductive layer is composed of doped polysilicon that can be formed by LPCVD and doped with arsenic ions or phosphorus ions by diffusion or implantation or in-situ ion doped. techniques. The fourth conductive layer is composed of tungsten suicide that can be formed by CVD process. Afterwards, the third and fourth conductive layers are patterned to form the gate 280' and the passing word line 282. Portions of the third conductive layer and the fourth conductive layer on the surface of the substrate 204 and Shallow Trench Isolation 240 are removed.

Figure 2P:
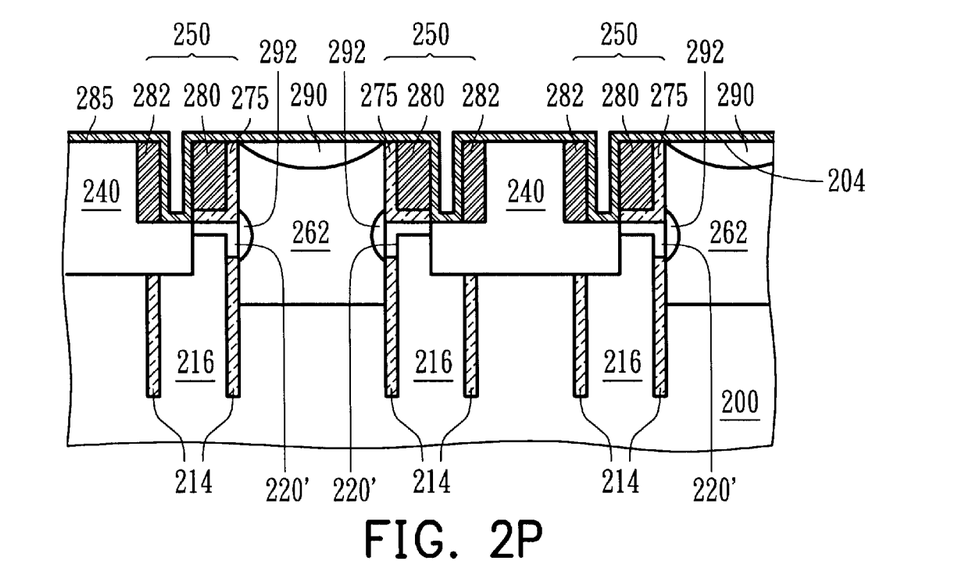

Referring to FIG. 2P, a drain region 290 is formed after forming the gate 280. The impurities contained in the buried strap 220' out-diffuse into the substrate 200 because of the high temperature of the mentioned processes and form the source region 292. The source region 292 is beneath the surface of the substrate 204 and is vertically to the drain region 290. The fourth insulating layer 285 is formed on the surface of the substrate 204 to cover the substrate 200, the gate 280, the passing word line 282 and the Shallow Trench Isolation 240. The fourth insulating layer 285 is composed of silicon nitride formed by CVD technique and has a thickness of 200–450 angstroms.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of fabricating memory cell with vertical transistor, comprising:

providing a semiconductor substrate;

forming a pad layer on the surface of the substrate;

forming a deep trench in the substrate;

forming a trench capacitor at the lower portion of the deep trench;

forming a collar oxide layer on sidewalls of the upper portion of said deep trench that is above trench capacitor;

forming a first conductive layer above said trench capacitor and fills said deep trench;

etching said first conductive layer to a first predetermined depth in said deep trench to form a first opening;

removing a portion of said collar oxide layer above said first conductive layer;

forming a second conductive layer to fill said first opening;

performing an planarization process to remove said second conductive layer over said pad layer;

patterning said pad layer, said substrate, said second conductive layer, said collar oxide layer and said first conductive layer to a second predetermined depth to form a second opening;

forming a first insulating layer on both of the said pad layer and said second conductive layer to fill said second opening;

removing a portion of said first insulating layer to form a Shallow Trench Isolation;

removing the portion of both sides of said Shallow Trench Isolation and said second conductive layer to a third predetermined depth to form a third opening, in which the residual second conductive layer forms a buried strap;

removing said pad layer to expose said surface of the substrate;

forming a second insulating layer on the exposed surface of said substrate and the surface of said buried strap;

forming a well at the upper portion of the substrate;

removing said second insulating layer;

forming a third insulating layer on the exposed surface of said substrate and the surface of said buried strap to form a gate oxide;

sequentially forming a third conductive layer and a fourth conductive layer to fill the fourth opening and to cover the surface of both the substrate and the shallow trench isolation;

patterning the third conductive layer and the fourth conductive layer to form a gate;

forming source and drain regions; and forming a fourth insulating layer.

2. The method of claim 1, wherein the semiconductor substrate is a silicon substrate.

3. The method of claim 1, wherein the pad layer is composed of a pad nitride layer and a pad oxide layer.

4. The method of claim 1, wherein said first conductive layer is composed of polysilicon doped with arsenic ions or phosphorus ions.

5. The method of claim 1, wherein said first conductive layer has a thickness of 2500 to 4000 angstroms.

6. The method of claim 1, wherein said second conductive layer is composed of polysilicon doped with arsenic ions or phosphorus ions.

7. The method of claim 1, wherein said second conductive layer has a thickness of 2500 to 4000 angstroms.

8. The method of claim 1, wherein said first predetermined depth is 2500 to 5500 angstroms beneath the surface of the substrate.

9. The method of claim 1, wherein said second predetermined depth is 3000 to 6000 angstroms beneath the surface of the substrate.

10. The method of claim 1, wherein said third predetermined depth is 2000 to 5000 angstroms beneath the surface of the substrate.

11. The method of claim 1, wherein said first insulating layer is composed of a material selected from the group consisting of oxide layer and High Density Plasma Oxide layer.

12. The method of claim 1, wherein said first insulating layer has a thickness of 4000 to 7000 angstroms.

13. The method of claim 1, wherein said second insulating layer is composed of thermal oxide layer formed by rapid thermal oxidation.

14. The method of claim 1, wherein said second insulating layer has a thickness of 50 to 150 angstroms.

15. The method of claim 1, wherein said third insulating layer is composed of thermal oxide layer by thermal oxidation process.

16. The method of claim 1, wherein said third insulating layer has a thickness of 50 to 150 angstroms.

17. The method of claim 1, wherein said fourth insulating layer is composed of silicon nitride.

18. The method of claim 1, wherein said fourth insulating layer has a thickness of 200 to 450 angstroms.

19. The method of claim 1, wherein said third conductive layer has a thickness about 650 to 1000 angstroms.

20. The method of claim 1, wherein said fourth conductive layer has a thickness about 500 to 900 angstroms.

* * * * *